United States Patent
Kim et al.

(10) Patent No.: US 9,919,917 B2
(45) Date of Patent: Mar. 20, 2018

(54) INERTIAL SENSOR AND METHOD OF MANUFACTURING THE SAME

(71) Applicant: SAMSUNG ELECTRO-MECHANICS CO., LTD., Suwon-Si (KR)

(72) Inventors: Jong Woon Kim, Suwon-Si (KR); Won Kyu Jeung, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 664 days.

(21) Appl. No.: 14/514,356

(22) Filed: Oct. 14, 2014

(65) Prior Publication Data
US 2015/0031161 A1    Jan. 29, 2015

Related U.S. Application Data

(62) Division of application No. 13/177,485, filed on Jul. 6, 2011, now Pat. No. 8,887,569.

(30) Foreign Application Priority Data

May 26, 2011    (KR) .................. 10-2011-0050200

(51) Int. Cl.
*B81C 1/00* (2006.01)
*G01P 15/08* (2006.01)
(Continued)

(52) U.S. Cl.
CPC .......... *B81C 1/00158* (2013.01); *G01C 19/56* (2013.01); *G01P 15/0802* (2013.01);
(Continued)

(58) Field of Classification Search
CPC .............. B81C 1/0058; B81C 1/00571; B81C 1/00531; B81C 1/00484; B81C 1/00539;
(Continued)

(56) References Cited

U.S. PATENT DOCUMENTS 5,576,250 A * 11/1996 Diem .................... B81B 3/0051
                                                       257/254
6,772,632 B2 * 8/2004 Okada .................. B81B 3/0062
                                                       438/53
(Continued)

OTHER PUBLICATIONS

Office Action dated Dec. 24, 2013 for U.S. Appl. No. 13/177,485.

*Primary Examiner* — Anita K Alanko
(74) *Attorney, Agent, or Firm* — NSIP Law

(57) ABSTRACT

Disclosed herein an inertial sensor and a method of manufacturing the same. An inertial sensor 100 according to a preferred embodiment of the present invention is configured to include a plate-shaped membrane 110, a mass body 120 that includes an adhesive part 123 disposed under a central portion 113 of the membrane 110 and provided at the central portion thereof and a patterning part 125 provided at an outer side of the adhesive part 123 and patterned to vertically penetrate therethrough, and a first adhesive layer 130 that is formed between the membrane 110 and the adhesive part 123 and is provided at an inner side of the patterning part 125. An area of the first adhesive layer 130 is narrow by isotropic etching using the patterning part 125 as a mask, thereby making it possible to improve sensitivity of the inertial sensor 100.

7 Claims, 9 Drawing Sheets

(51) Int. Cl.
*G01P 15/09* (2006.01)
*G01P 15/18* (2013.01)
*G01C 19/56* (2012.01)
*B81B 3/00* (2006.01)
*C09K 13/08* (2006.01)
*C09K 13/00* (2006.01)

(52) U.S. Cl.
CPC .......... *G01P 15/0922* (2013.01); *G01P 15/18* (2013.01); *B81B 3/007* (2013.01); *B81B 3/0062* (2013.01); *B81B 2201/0235* (2013.01); *B81B 2203/053* (2013.01); *B81C 1/00484* (2013.01); *B81C 1/00531* (2013.01); *B81C 1/00539* (2013.01); *B81C 1/00571* (2013.01); *B81C 2201/01* (2013.01); *B81C 2201/014* (2013.01); *B81C 2201/0132* (2013.01); *B81C 2201/0133* (2013.01); *C09K 13/00* (2013.01); *C09K 13/08* (2013.01); *G01P 2015/084* (2013.01); *G01P 2015/0871* (2013.01)

(58) Field of Classification Search
CPC ........ B81C 2201/01; B81C 2201/0133; B81C 2201/014; B81C 2201/0132; B81B 3/007; B81B 3/0062; B81B 2203/053; G01C 19/56; G01P 15/0922; G01P 15/18; G01P 15/0802; G01P 2015/084; G01P 2015/0871; C09K 13/00; C09K 13/08
See application file for complete search history.

(56) References Cited

U.S. PATENT DOCUMENTS

| | | | |
|---|---|---|---|
| 7,357,026 B2 | 4/2008 | Ozawa | |
| 7,389,691 B2* | 6/2008 | Kai | G01P 15/123 73/514.33 |
| 7,845,229 B2 | 12/2010 | Nakatani | |
| 2011/0215067 A1* | 9/2011 | Nomura | G01P 15/0802 216/11 |
| 2012/0152020 A1* | 6/2012 | Kim | G01P 15/09 73/514.32 |
| 2016/0069926 A1* | 3/2016 | Kim | G01P 15/123 310/323.21 |

* cited by examiner

INERTIAL SENSOR AND METHOD OF MANUFACTURING THE SAME

CROSS REFERENCE TO RELATED APPLICATION

This application is a divisional of U.S. patent application Ser. No. 13/177,485 filed on Jul. 6, 2011, which claims the benefit of Korean Patent Application No. 10-2011-0050200, filed on May. 26, 2011, entitled "Inertial Sensor And Method Of Manufacturing The Same" which are hereby incorporated by reference in their entireties into this application.

BACKGROUND OF THE INVENTION

1. Technical Field

The present invention relates to an inertial sensor and a method of manufacturing the same.

2. Description of the Related Art

Recently, an inertial sensor has been used in various fields, for example, the military, such as an artificial satellite, a missile, an unmanned aircraft, or the like, vehicles, such as an air bag, electronic stability control (ESC), a black box for a vehicle, or the like, hand shaking prevention of a camcorder, motion sensing of a mobile phone or a game machine, navigation, or the like.

The inertial sensor generally adopts a configuration in which a mass body is bonded to a flexible substrate such as a membrane, or the like, so as to measure acceleration and angular velocity. Through the configuration, the inertial sensor may calculate the acceleration by measuring inertial force applied to the mass body and may calculate the angular velocity by measuring Coriolis force applied to the mass body.

A process of measuring the acceleration and the angular velocity by using the inertial sensor will be described in detail below. First, the acceleration may be obtained by Newton's law of motion "F=ma", where "F" represents inertial force applied to the mass body, "m" represents a mass of the mass body, and "a" is acceleration to be measured. Therefore, the acceleration a may be obtained by sensing the force F applied to the mass body and dividing the sensed force F by the mass m of the mass body that is a predetermined value. Further, the angular velocity may be obtained by Coriolis force "F=2mΩ·v", where "F" represents the Coriolis force applied to the mass body, "m" represents the mass of the mass body, "Ω" represents the angular velocity to be measured, and "v" represents the motion velocity of the mass body. Among others, since the motion velocity v of the mass body and the mass m of the mass body are values that are known in advance, the angular velocity Ω may be obtained by sensing the Coriolis force (F) applied to the mass body.

As described above, when the acceleration a is measured by the inertial sensor, the mass body may be displaced by the inertial force F. In addition, when the angular velocity Ω is measured by the inertial sensor, the mass body is vibrated by the motion velocity v. As described above, in order to measure the acceleration a or the angular velocity Ω, there is a need to move the mass body according to the elasticity of the membrane and in order to improve the sensitivity of the inertial sensor, it is preferable to make the mass of the mass body large and it is preferable to make a spring constant of the membrane small.

FIGS. 1 to 3 are process cross-sectional views showing a method of manufacturing an inertial sensor according to the prior art in a process order. A problem of the prior art will be described with reference to FIGS. 1 to 3.

First, as shown in FIGS. 1 and 2, a mass body 2 and a post 3 are formed by preparing a silicon on insulator (SOI) substrate and then, selectively removing a support substrate 1 of the SOI substrate.

Thereafter, as shown in FIG. 3, an insulating layer 6 (silicon oxide) is selectively removed by supplying an etchant between the mass body 2 and the post 3, thereby forming an adhesive layer 4. In this case, an area of the adhesive layer 4 determines the spring constant of a membrane 5. In detail, as the area of the adhesive layer 4 is narrow, the area of the membrane 5 having elasticity is substantially wide, such that the spring constant is reduced, thereby increasing the sensitivity of the inertial sensor 10. Therefore, although it is preferable that the area of the adhesive layer 4 is gradually narrow, the area of the adhesive layer 4 is affected by a cross sectional area of the mass body 2 even in the case of considering an undercut phenomenon since the adhesive layer 4 is removed by supplying the etchant between the mass body 2 and the post 3. Therefore, in order to narrow the area of the adhesive layer 4, the cross sectional area of the mass body 2 is also narrow. In this case, however, the mass of the mass body 2 is reduced and thus, the sensitivity of the inertial sensor 10 is degraded.

As a result, the inertial sensor 10 according to the prior art has a limitation in improving the sensitivity of the inertial sensor 10 since it is impossible to reduce the spring constant of the membrane 5 while increasing the mass of the mass body 2 in the manufacturing process.

SUMMARY OF THE INVENTION

The present invention has been made in an effort to provide an inertial sensor and a method of manufacturing the same capable of narrowing an area of an adhesive layer by using a mass body including a patterning part patterned to vertically penetrate therethrough so as to reduce a spring constant of a membrane, thereby improving sensitivity of the inertial sensor.

According to a preferred embodiment of the present invention, there is provided an inertial sensor, including: a plate-shaped membrane; a mass body that includes an adhesive part disposed under a central portion of the membrane and provided at the central portion thereof and a patterning part provided at an outer side of the adhesive part and patterned to vertically penetrate therethrough; and a first adhesive layer that is formed between the membrane and the adhesive part and is provided at an inner side of the patterning part.

The first adhesive layer may be selectively removed by isotropic etching using the patterning part as a mask to be provided at an inner side of the patterning part.

The patterning part may be patterned so as to vertically penetrate therethrough by being provided with a plurality of holes.

The patterning part may be patterned to vertically penetrate therethrough by being provided with a plurality of first rib parts extending to an outer side of the adhesive part from the adhesive part.

The patterning part may be patterned to vertically penetrate therethrough by being provided with the plurality of first rib parts extending to the outer side of the adhesive part from the adhesive part and a plurality of second rib parts extending to the outer side of the adhesive part from the sides of the first rib parts at each predetermined distance.

The inertial sensor may further include: a post disposed at a bottom portion of an edge of the membrane so as to surround the mass body; and a second adhesive layer formed between the membrane and the post.

The inertial sensor may further include a support part that extends from the post in a direction of the mass body and is formed to be spaced apart from the bottom surface of the membrane by a predetermined distance.

According to another preferred embodiment of the present invention, there is provided a method of manufacturing an inertial sensor, including: (A) preparing a base member in which a first substrate, a second substrate, and a membrane are stacked in order; (B) patterning a patterning part of a mass body including an adhesive part provided at a central portion of the mass body and the patterning part provided at an outer side of the adhesive part so as to vertically penetrate therethrough while patterning the first substrate so as to form the mass body at the central portion of the first substrate; and (C) forming a first adhesive layer on the second substrate remaining at an inner side of the patterning part by selectively removing the second substrate between the membrane and the patterning part by isotropic etching using the patterning part as a mask.

At step (B), the patterning part may be patterned so as to vertically penetrate therethrough by being provided with a plurality of holes.

At step (B), the patterning part may be patterned so as to vertically penetrate therethrough by forming a plurality of first rib parts extending to an outer side of the adhesive part from the adhesive part.

At step (B), the patterning part may be patterned to vertically penetrate therethrough by being provided with the plurality of first rib parts extending to the outer side of the adhesive part from the adhesive part and a plurality of second rib parts extending to the outer side of the adhesive part from the sides of the first rib parts at each predetermined distance.

At step (B), the first substrate may be patterned so as to form a post surrounding the mass body at an edge of the first substrate.

At step (C), a second adhesive layer may be formed on the second substrate remaining between the membrane and the post by selectively removing the second substrate by isotropic etching using the mass body and the post as a mask.

At step (B), the patterning part may be patterned while patterning the first substrate by anisotropic etching.

At step (B), the first substrate may be patterned so as to form a support part extending from the post in a direction of the mass body, and at step (C), the support part may be spaced apart from a bottom surface of the membrane by removing the second substrate between the membrane and the support part by isotropic etching.

DESCRIPTION OF THE PREFERRED EMBODIMENTS

Figure 1:
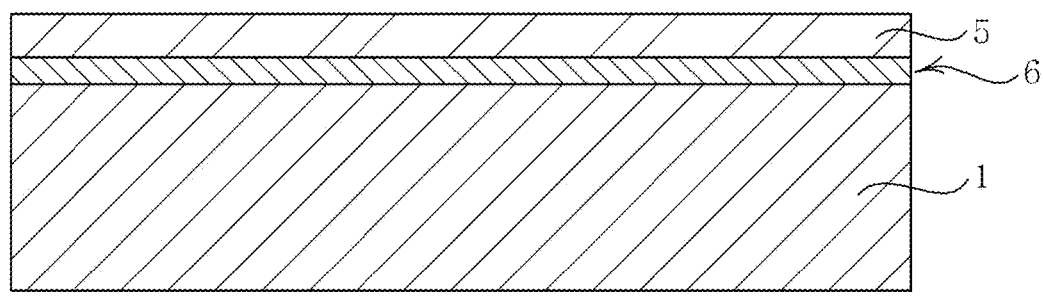
FIGS. 1 to 3 are process cross-sectional views showing a method of manufacturing an inertial sensor according to the prior art.
Figure 2:
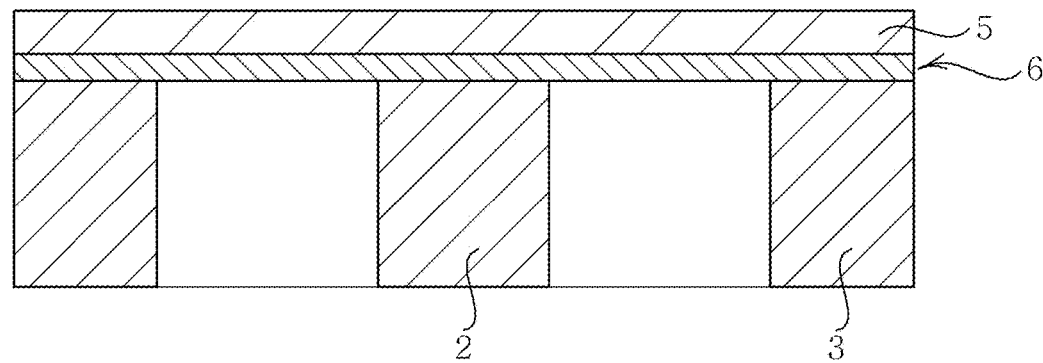
Figure 3:
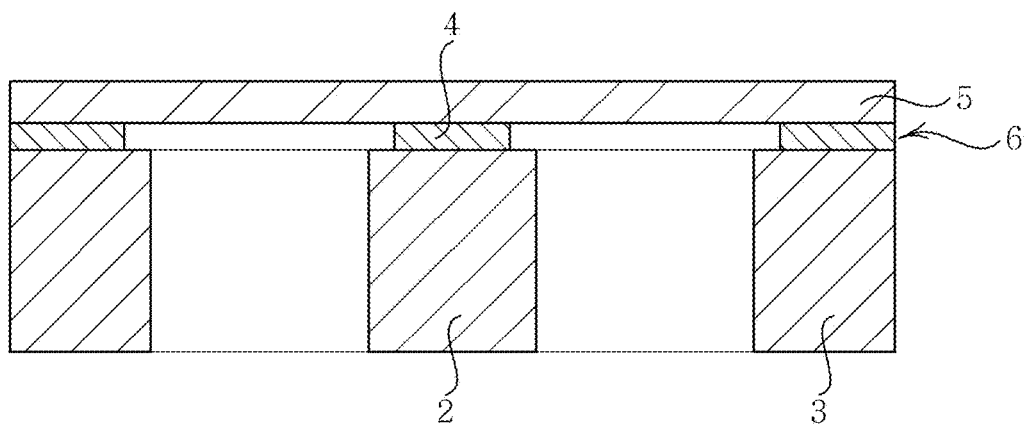

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Terms used in the specification, 'first', 'second', etc. can be used to describe various components, but the components are not to be construed as being limited to the terms. The terms are only used to differentiate one component from other components. Further, in describing the present invention, a detailed description of related known functions or configurations will be omitted so as not to obscure the subject of the present invention. Further, when it is determined that the detailed description of the known art related to the present invention may obscure the gist of the present invention, the detailed description will be omitted.

Hereinafter, the preferred embodiments of the present invention will be described in detail with reference to the accompanying drawings.

Figure 4:
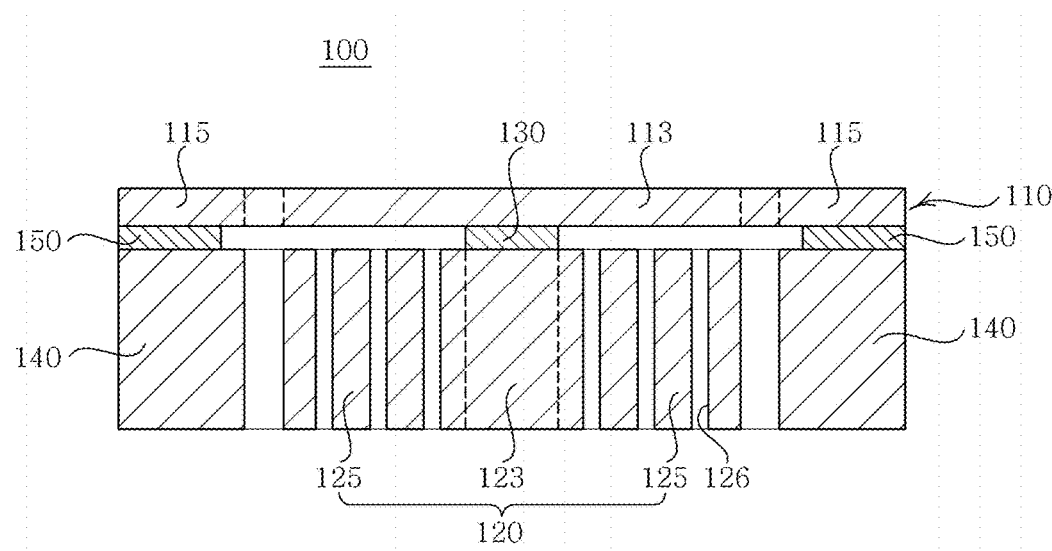
FIG. 4 is a cross-sectional view of an inertial sensor according to a preferred embodiment of the present invention.
Figure 5:
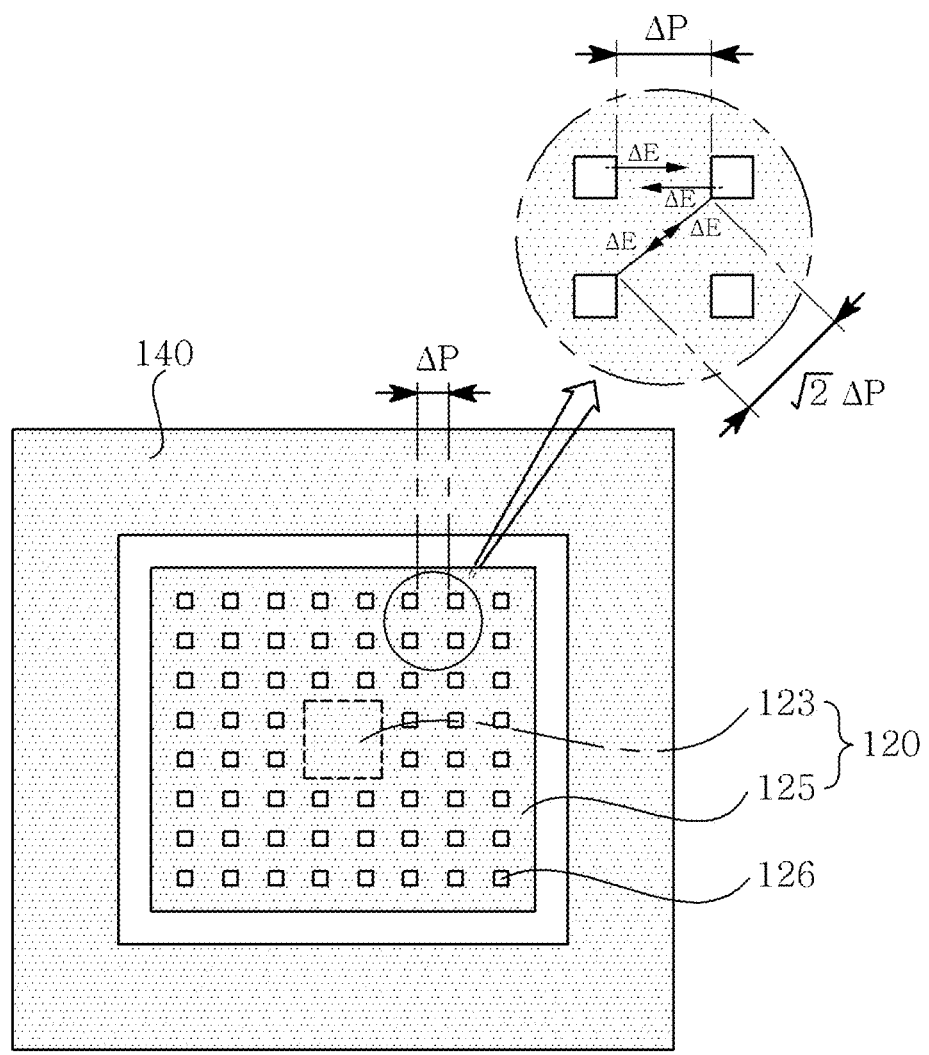
FIG. 5 is a plan view of a mass body and a post of an inertial sensor according to a preferred embodiment of the present invention.
Figure 6:
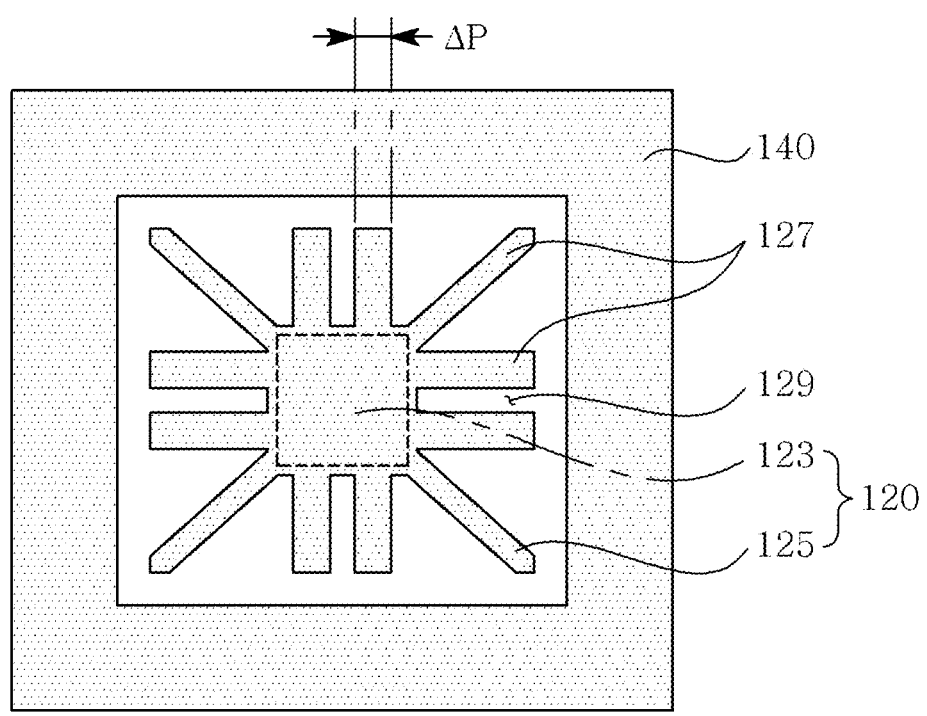
FIGS. 6 and 7 are plan views showing a modified example of the mass body and the post shown in FIG. 5.
Figure 7:
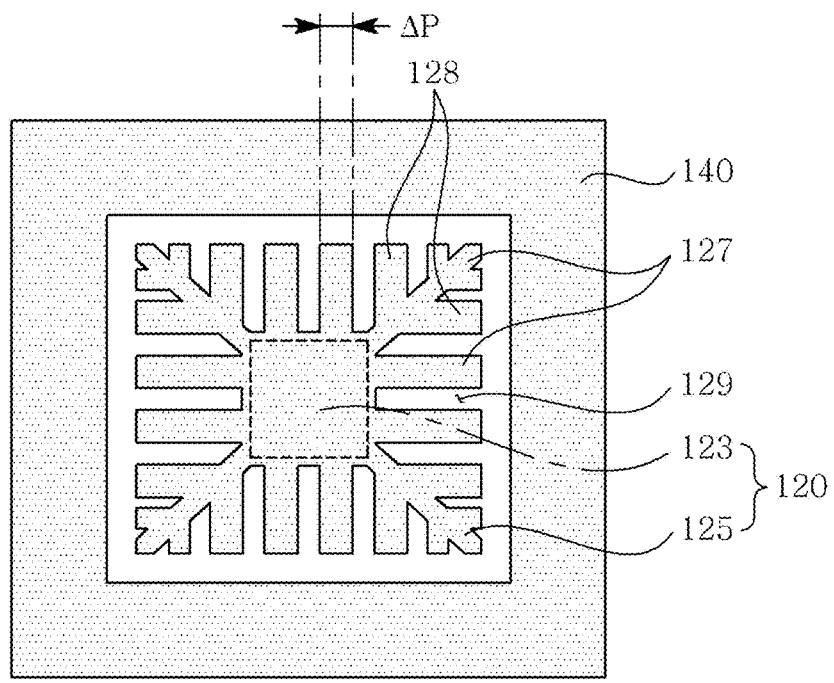

FIG. 4 is a cross-sectional view of an inertial sensor according to a preferred embodiment of the present invention, FIG. 5 is a plan view of a mass body and a post of an inertial sensor according to a preferred embodiment of the present invention, and FIGS. 6 and 7 are plan views showing a modified example of the mass body and the post shown in FIG. 5.

As shown in FIGS. 4 and 5, an inertial sensor 100 according to a preferred embodiment of the present invention is configured to include a plate-shaped membrane 110, a mass body 120 that includes an adhesive part 123 disposed under a central portion 113 of the membrane 110 and provided at the central portion thereof and a patterning part 125 provided at an outer side of the adhesive part 123 and patterned to vertically penetrate therethrough, and a first adhesive layer 130 that is formed between the membrane 110 and the adhesive part 123 and is provided at an inner side of the patterning part 125.

The membrane 110 is formed in a plate shape and has elasticity so as to vibrate the mass body 120. In this configuration, a boundary of the membrane 110 is not accurately partitioned but may be partitioned into a central portion 113 provided at the center of the membrane 110 and an edge 115 provided along the outside of the membrane 110. In this case, the bottom portion of the central portion 113 of the membrane 110 is provided with the mass body 120, such that the central portion 113 of the membrane 110 is displaced in response to the movement of the mass body 120. In addition, the bottom portion of the edge 115 of the membrane 110 is provided with the post 140 to serve to support the central portion 113 of the membrane 110. Meanwhile, the membrane 110 is provided with a piezoelectric substance such as lead zirconate titanate and an electrode to sense the displacement of the mass body 120 by using a piezoelectric effect or vibrate the mass body 120 by using an inverse piezoelectric effect. However, the inertial sensor 100 according to the preferred embodiment of the present invention does not necessarily depend on a piezoelectric scheme using the piezoelectric substance, but may depend on all of the driving schemes or the sensing schemes, such as a piezoresistive scheme or a capacitive scheme, which are known to those skilled in the art.

The mass body 120 is displaced by inertial force or Coriolis force and is disposed at the bottom portion of the central portion 113 of the membrane 110. In detail, the mass body 120 is partitioned into the adhesive part 123 provided at the central portion thereof and the patterning part 125 provided at the outer side of the adhesive part 123. In this configuration, the adhesive part 123 is a part that is attached to the bottom surface of the membrane 110 through the first adhesive layer 130. Further, the patterning part 125 is a patterning part so as to vertically penetrate therethrough (a vertical direction with respect to a plate-shaped membrane 110) and the first adhesive layer 130 is not present between the patterning part 125 and the bottom surface of the membrane 110. The reason why the first adhesive layer 130 is not present between the patterning part 125 and the membrane 110 is to selectively remove the first adhesive layer 130 by isotropic etching using the patterning part 125 as a mask during a manufacturing process. As described above, only the adhesive part 123 of the mass body 120 is attached to the bottom surface of the membrane 110 by the first adhesive layer 130 and the patterning part 125 is not attached to the bottom surface of the membrane 110. Therefore, when being compared with the inertial sensor according to the prior art, an area of the first adhesive layer 130 may be narrow and thus, a spring constant of the membrane 110 may be relatively reduced. Further, since an area of the first adhesive layer 130 may be freely controlled by using the patterning part 125, a cross sectional area of the mass body 120 may be widened, thereby making it possible to increase a mass of the mass body 120. As described above, the inertial sensor 100 according to the preferred embodiment of the present invention may reduce the spring constant of the membrane 110 and increase the mass of the mass body 120, such that the displacement of the mass body 120 may be increased in regards to the same acceleration or angular velocity, thereby making it possible to improve the sensitivity of the inertial sensor 100.

Meanwhile, the shape of the patterning part 125 of the mass body 120 is not specifically limited if the patterning part 125 is configured to vertically penetrate therethrough so as to be used as the mask. However, in order to equally remove the first adhesive layer 130 by isotropic etching using the patterning part 125 as the mask, the patterning part 125 may be preferably patterned by forming a plurality of holes 126. More preferably, the plurality of holes 126 may be formed at a predetermined distance ΔP (see FIG. 5). In addition to this, the patterning part 125 may be patterned so as to form rib parts 127 and 128 as shown in FIGS. 6 and 7. In detail, the patterning part 125 may be patterned so as to form the plurality of first rib parts 127 that extend to the outer side of the adhesive part 123 from the adhesive part 123 (see FIG. 6). Alternatively, the patterning part 125 may be patterned so as to form the first rib part 127 and the plurality of second rib parts 128 extending to the outer side of the adhesive part 123 from the side of the first rib part 127 at each predetermined distance (see FIG. 7). That is, the patterning part 125 may be patterned so as to form the first rib part 127 or the second rib part 128 by machining a plurality of slits 129 in an outer direction of the adhesive part 123. Meanwhile, the patterning part 125 is provided with the plurality of machined slits 129 and a support part 160 may be disposed between the slits 129 (see FIG. 10). The detailed description thereof will be described below.

As described above, since the patterning part 125 of the mass body 120 vertically penetrates therethrough to freely communicate with the air, the damping force is reduced due to the viscosity of air at the time of vibration, such that the displacement of the mass body 120 is increased, thereby making it possible to increase the sensitivity of the inertial sensor 100.

As shown in FIG. 4, the first adhesive layer 130 is formed between the membrane 110 and the adhesive part 123 to serve to bond the mass body 120 to the membrane 110. As described above, the first adhesive layer 130 is removed by isotropic etching using the patterning part 125 as the mask during the manufacturing process and is thus provided at only the inner side of the patterning part 125.

Meanwhile, the bottom portion of the edge 115 of the membrane 110 is disposed with the post 140 that supports the membrane 110. In this configuration, the post 140 is formed in a hollow shape surrounding the mass body 120 so as to secure a space that may displace the mass body 120. For example, the post 140 may be formed in a square column shape in which a cavity is formed at the center thereof (see FIG. 5). Meanwhile, a second adhesive layer 150 is formed between the membrane 110 and the post 140, such that the post 140 is bonded to the bottom surface of the membrane 110 by the second adhesive layer 150 (see FIG. 4).

Figure 8:
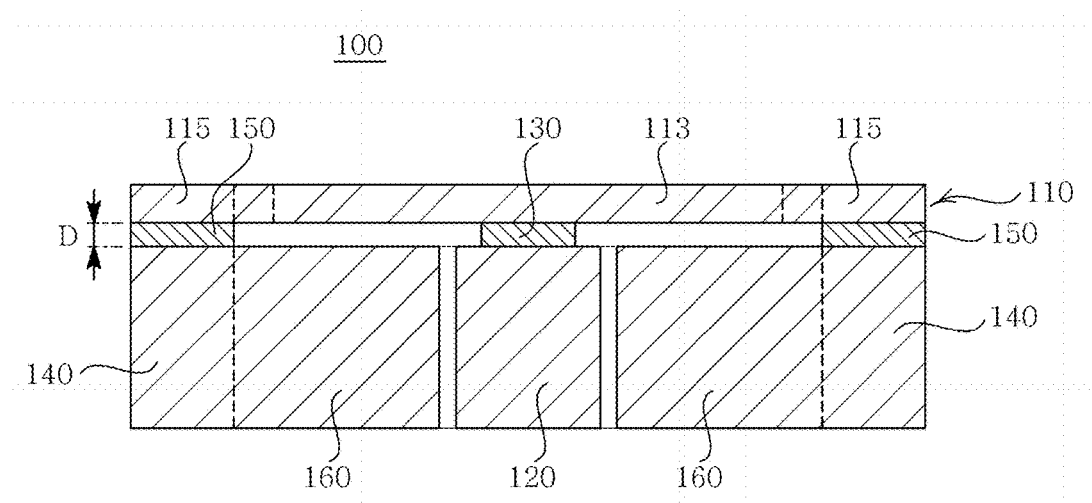
FIG. 8 is a cross-sectional view showing a modified example of the inertial sensor according to the preferred embodiment of the present invention.
Figure 9:
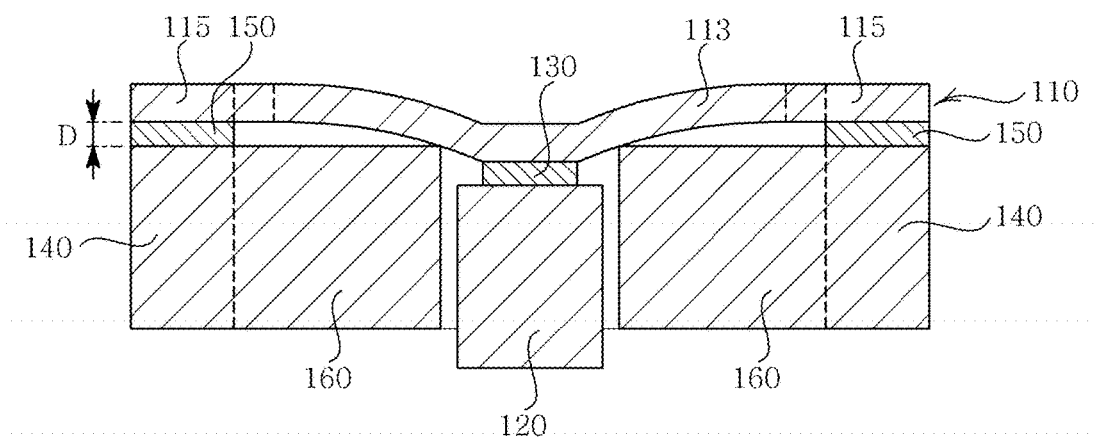
FIG. 9 is a cross-sectional view showing a process of limiting downward displacement of the inertial sensor shown in FIG. 8.
Figure 10:
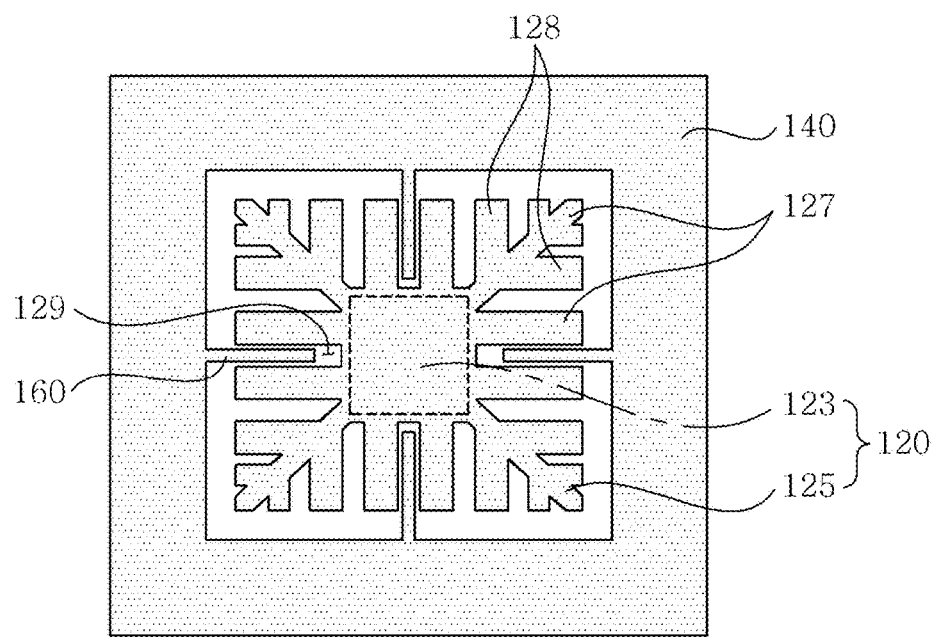
FIG. 10 is a plan view of a mass body, a post, and a support part of the inertial sensor shown in FIG. 8.

FIG. 8 is a cross-sectional view showing a modified example of the inertial sensor according to the preferred embodiment of the present invention, FIG. 9 is a cross-sectional view showing a process of limiting downward displacement of the inertial sensor shown in FIG. 8, and FIG. 10 is a plan view of a mass body, a post, and a support part of the inertial sensor shown in FIG. 8.

As shown in FIGS. 8 to 10, the inertial sensor 100 according to the preferred embodiment of the present invention may further include the support part 160 that serves to limit the downward displacement of the mass body 120. In this configuration, four support parts 160 are formed in a pin shape along the inner side of the post 140 at a predetermined distance and may extend in the direction of the mass body 120 (see FIG. 10). However, the support part 160 is not necessarily provided in four and may be formed in two or more along the inner side of the post 140 at equidistance. That is, the support part 160 may be formed in two along the inner side of the post 140 at a distance of 180° or may be formed in three along the inner side of the post 140 at a distance of 120°. Meanwhile, when the patterning part 125 is provided with the plurality of machined slits 129, the pin-shaped support part 160 may extend immediately before the adhesive part 123 of the mass body 120 along between the slits 129. Therefore, the downward displacement of the mass body 120 may be easily limited and the inner space of the inertial sensor 100 may be efficiently used, by freely controlling the length of the support part 160 while maintaining the size of the mass body 120. In addition, the support part 160 is disposed to be spaced apart from the bottom surface of the membrane 110 by a predetermined distance D (see FIG. 8). The predetermined distance D is a reference limiting the downward displacement of the mass body 120 and even though an excessive force exceeding tolerance is applied to the mass body 120, the displacement in the downward direction of the mass body 120 is limited to the predetermined distance D between the support part 160 and the membrane 110 (see FIG. 9).

FIGS. 11 to 14 are process cross-sectional views showing a method of manufacturing an inertial sensor according to a preferred embodiment of the present invention in a process order.

As shown in FIGS. 11 to 14, the inertial sensor 100 according to the preferred embodiment of the present invention is configured to include (A) preparing a base member 170 in which a first substrate 180, a second substrate 190, and the membrane 110 are stacked in order, (B) patterning the patterning part 125 of the mass body 120 including the adhesive part 123 provided at the central portion of the mass body 120 and the patterning part 125 provided at the outer side of the adhesive part 123 so as to vertically penetrate therethrough while patterning the first substrate 180 so as to form the mass body 120 at the central portion 183 of the first substrate 180, and (C) forming the first adhesive layer 130 on the second substrate 190 remaining at the inner side of the patterning part 125 by selectively removing the second substrate 190 between the membrane 110 and the patterning part 125 by isotropic etching using the patterning part 125 as the mask.

Figure 11:
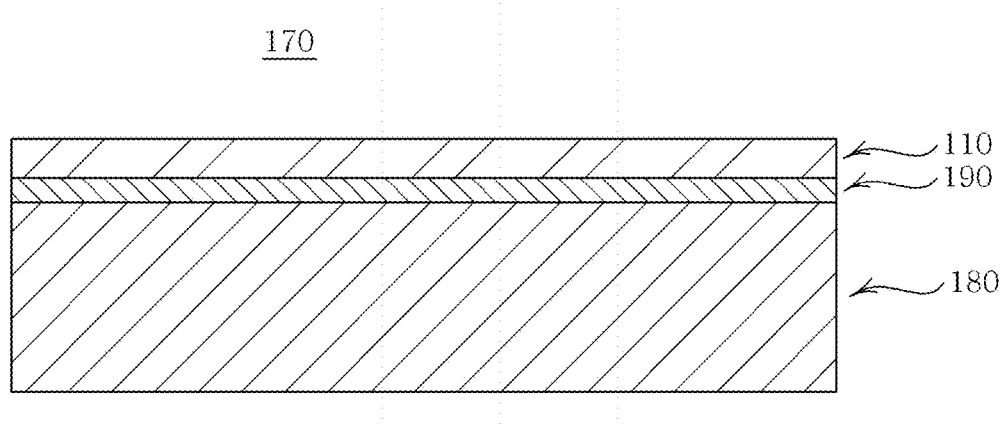
FIGS. 11 to 14 are process cross-sectional views showing a method of manufacturing an inertial sensor according to a preferred embodiment of the present invention in a process order.

First, as shown in FIG. 11, a step of preparing the base member 170 in which the first substrate 180, the second substrate 190, and the membrane 110 are stacked in order is performed. In this case, a material of the base member 170 is not specifically limited, but it is preferable to use a silicon on insulator (SOI) substrate to which a micro electro mechanical systems (MEMS) process is easily applied. In this case, the first substrate 180 is a support substrate of the SOI substrate, the second substrate 190 is an insulating layer (silicon oxide) of the SOI substrate, and the membrane 110 is an upper silicon layer of the SOI substrate.

Figure 12:
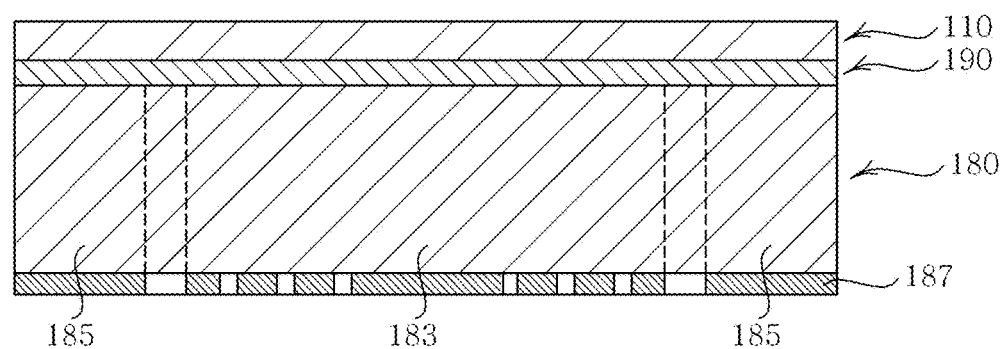
Figure 13:
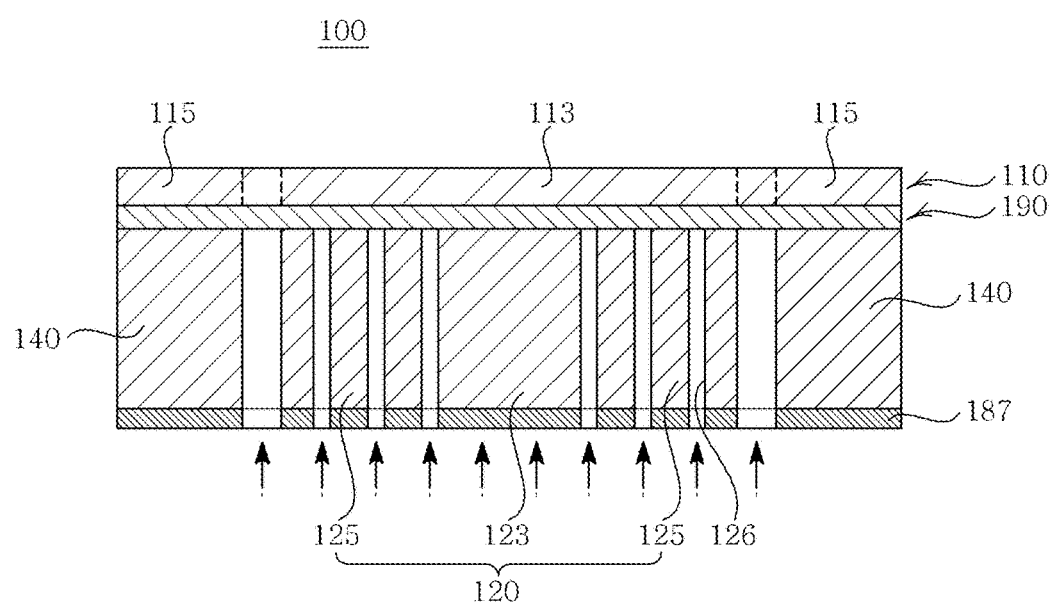

Next, as shown in FIGS. 12 and 13, a step of patterning the patterning part 125 of the mass body 120 to vertically penetrate therethrough is performed while forming the mass body 120 by patterning the first substrate 180. In detail, the central portion 183 and side portions 185 of the first substrate 180 are provided with the mass body 120. In addition, the mass body 120 is partitioned into the adhesive part 123 provided at the central portion of the mass body 120 and the patterning part 125 provided at the outer side of the adhesive part 123 and the patterning part 125 is to vertically penetrate therethrough. Therefore, a mask 187 corresponding to the mass body 120 and the patterning part 125 is disposed on the first substrate 180 (see FIG. 12) and then, the first substrate 180 is selectively removed through an etching process (see FIG. 13). In this case, it is preferable that the etching process may use anisotropic etching so as to remove the first substrate 180 in a vertical direction of the membrane 110. The anisotropic etching is not specifically limited, but may preferably use dry etching and may more preferably use deep reactive ion etching (DRIE). The DRIE is a process of performing the etching by simultaneously progressing the physical impact and the chemical reaction of the ions formed by plasma. In particular, the DRIE may precisely remove the first substrate 180 and may perform the selective etching according to a material, such that only the first substrate 180 among the first substrate 180 and the mask 187 may be etched.

In this case, the plurality of holes 126 may be formed on the patterning part 125 (see FIG. 5), the plurality of first rib parts 127 extending to the outer side of the adhesive part 123 from the adhesive part 123 may be formed (see FIG. 6), and the plurality of second rib parts 128 extending to the outer side of the adhesive part 123 from the side of the first rib part 127 at each predetermined distance may additionally be formed at the first rib part 127 (see FIG. 7).

Meanwhile, the post 140 surrounding the mass body 120 may be formed at the edge of the first substrate 180 while forming the mass body 120 at the central portion 183 of the first substrate 180 by patterning the first substrate 180. In addition, the support part 160 extending from the post 140 in the direction of the mass body 120 by patterning the first substrate 180 simultaneously with the mass body 120 and the post 140 may be formed (see FIG. 8). In detail, the mass body 120, the post 140, and the support part 160 may be simultaneously formed when the mask 187 corresponding to the shape of the mass body 120, the post 140, and the support part 160 is disposed on the first substrate and then, the first substrate 180 is selectively removed by the etching process.

Figure 14:
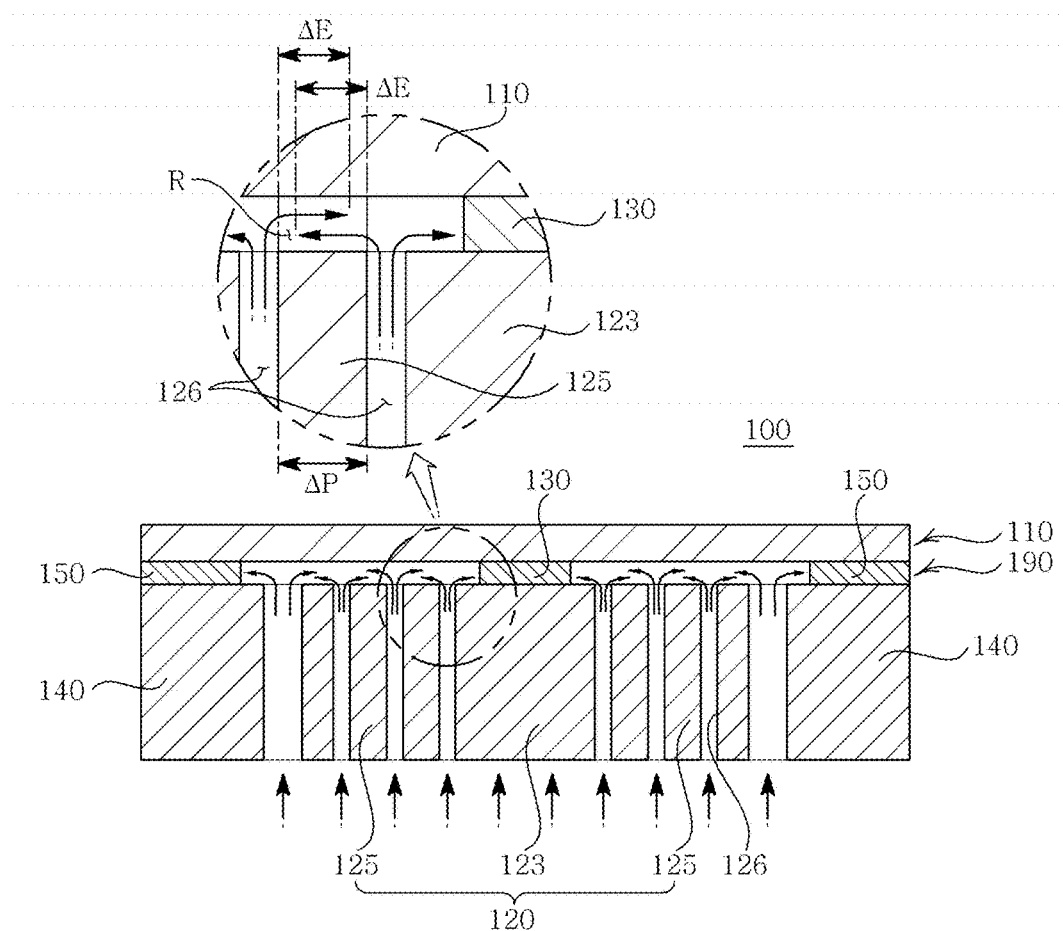

Next, as shown in FIG. 14, a step of forming of the first adhesive layer 130 on the second substrate 190 remaining at the inner side of the patterning part 125 by selectively removing the second substrate 190 between the membrane 110 and the patterning part 125 by isotropic etching using the patterning part 125 as the mask is performed. At the previous step, since the patterning part 125 is patterned so as to vertically penetrate therethrough, the isotropic etching may be performed using the patterning part 125 as the mask at the present step. Since the second substrate 190 is removed by isotropic etching, the undercut phenomenon in which the second substrate 190 is removed in both of the thickness direction and the plane direction occurs. Therefore, the second substrate 190 between the patterning part 125 and the membrane 110 may be removed and the first adhesive layer 130 may finally be formed on the second substrate remaining at only the inner side of the patterning part 125. However, in order to completely remove the second substrate 190 between the patterning part 125 and the membrane 110, a predetermined portion (R: see an enlarged view of FIG. 14) corresponding between the holes 126 on the second substrate 190 is to be removed. However, the undercut phenomenon occurs at the predetermined portion R from two adjacent holes 126 to remove the second substrate 190 by a predetermined depth $\Delta E$ in a plane direction. Therefore, the depth $\Delta E$ in which the second substrate 190 is removed in the plane direction by isotropic etching is larger than ½ of the distance $\Delta P$ of the hole 126 of the patterning part 125, such that the second substrate 190 between the patterning part 125 and the membrane 110 can be completely removed ($\Delta E > \Delta P/2$). However, as shown in an enlarged view of FIG. 5, the above contents describe two adjacent holes 126 at the shortest distance $\Delta P$ as a reference but when the two adjacent holes 126 on a diagonal line are described as the reference, the depth $\Delta E$ in which the second substrate 190 is removed by isotropic etching to be larger than $\sqrt{2} \times$ ½ of the distance $\Delta P$ between the holes 126 of the patterning part 125.

In addition, although the case in which the hole 126 is formed on the patterning part 125 is described as the reference, it is preferable that the depth ΔE in which the second substrate 190 is removed in the plane direction by isotropic etching is larger than ½ of the slit distance (ΔP; see FIGS. 6 to 7) of the slit 129 of the patterning part 125 even when the first rib part 127 or the second rib part 128 are formed. Meanwhile, the isotropic etching is not specifically limited but may use wet etching using an etchant. In this case, as the etchant, an HF aqueous solution may be used.

As described above, since the first adhesive layer 130 is formed by removing the second substrate 190 between the membrane 110 and the patterning part 125, the area of the first adhesive layer 130 may be narrow and thus, the spring constant of the membrane 110 is relatively reduced, thereby making it possible to improve the sensitivity of the inertial sensor 100.

Meanwhile, at the previous step, when the post 140 is formed by patterning the first substrate 180, at the present step, the second adhesive layer 150 may be formed on the second substrate 190 remaining between the membrane 110 and the post 140 by selectively removing the second substrate 190 by isotropic etching using the mass body 120 and the post 140 as the mask.

Further, at the previous step, when the support part 160 is formed by patterning the first substrate 180, at the present step, the bottom surface of the membrane 110 may be spaced apart from the support part 160 by removing the second substrate 190 between the membrane 110 and the support part 160 by isotropic etching (see FIG. 8).

As set forth above, the preferred embodiment of the present invention uses the mass body including the patterning part patterned to vertically penetrate therethrough and narrows the area of the adhesive layer by isotropic etching using the patterning part as the mask to reduce the spring constant of the membrane, thereby making it possible to improve the sensitivity of the inertial sensor.

Further, the preferred embodiment of the present invention freely controls the area of the first adhesive layer by using the patterning part to be designed to widen the cross sectional area of the mass body so as to increase the mass of the mass body, thereby making it possible to improve the sensitivity of the inertial sensor.

In addition, the preferred embodiment of the present invention reduces the damping force due to the viscosity of air at the time of vibration by forming the mass body including a patterning part patterned to vertically penetrate therethrough so as to increase the displacement of the mass body, thereby making it possible to increase the sensitivity of the inertial sensor.

Although the embodiment of the present invention has been disclosed for illustrative purposes, it will be appreciated that an inertial sensor and a method of manufacturing the same according to the invention are not limited thereby, and those skilled in the art will appreciate that various modifications, additions and substitutions are possible, without departing from the scope and spirit of the invention. Accordingly, any and all modifications, variations or equivalent arrangements should be considered to be within the scope of the invention, and the detailed scope of the invention will be disclosed by the accompanying claims.

What is claimed is:

1. A method of manufacturing an inertial sensor, comprising:
   (A) preparing a base member in which a first substrate, a second substrate, and a membrane are stacked in order;
   (B) patterning a patterning part of a mass body including an adhesive part provided at a central portion of the mass body and the patterning part provided at an outer side of the adhesive part so as to vertically penetrate therethrough while patterning the first substrate so as to form the mass body at the central portion of the first substrate; and
   (C) forming a first adhesive layer on the second substrate remaining at an inner side of the patterning part by selectively removing the second substrate between the membrane and the patterning part by isotropic etching using the patterning part as a mask,
   wherein at step (B), the patterning part is patterned so as to vertically penetrate therethrough by being provided with the plurality of first rib parts extending to the outer side of the adhesive part from the adhesive part and a plurality of second rib parts extending to the outer side of the adhesive part from the sides of the first rib parts at each predetermined distance.

2. The method as set forth in claim 1, wherein at step (B), the first substrate is patterned so as to form a post surrounding the mass body at an edge of the first substrate.

3. The method as set forth in claim 2, wherein at step (C), a second adhesive layer is formed on the second substrate remaining between the membrane and the post by selectively removing the second substrate by isotropic etching using the mass body and the post as a mask.

4. The method as set forth in claim 1, wherein at step (B), the patterning part is patterned while patterning the first substrate by anisotropic etching.

5. The method as set forth in claim 2, wherein at step (B), the first substrate is patterned so as to form a support part extending from the post in a direction of the mass body, and at step (C), the support part is spaced apart from a bottom surface of the membrane by removing the second substrate between the membrane and the support part by isotropic etching.

6. The method as set forth in claim 1, wherein at step (B), the patterning part is patterned so as to vertically penetrate therethrough by being provided with a plurality of holes.

7. The method as set forth in claim 1, wherein at step (B), the patterning part is patterned so as to vertically penetrate therethrough by forming a plurality of first rib parts extending to an outer side of the adhesive part from the adhesive part.

* * * * *